United States Patent
Chiang et al.

(10) Patent No.: US 12,189,442 B2
(45) Date of Patent: Jan. 7, 2025

(54) METHOD FOR DETECTING HEAT DISSIPATION AND ELECTRONIC DEVICE

(71) Applicant: ASUSTeK COMPUTER INC., Taipei (TW)

(72) Inventors: Kun-Hsin Chiang, Taipei (TW); Yu-Chieh Chang, Taipei (TW); Tang-Hui Liao, Taipei (TW); Wei-Hsian Chang, Taipei (TW); Wen-Yen Hsieh, Taipei (TW); Chih-Wei Kuo, Taipei (TW); Ming-Yi Huang, Taipei (TW); Ching-Chan Chu, Taipei (TW); Shun-Po Chang, Taipei (TW)

(73) Assignee: ASUSTeK COMPUTER INC., Taipei (TW)

( * ) Notice: Subject to any disclaimer, the term of this patent is extended or adjusted under 35 U.S.C. 154(b) by 281 days.

(21) Appl. No.: 17/725,570

(22) Filed: Apr. 21, 2022

(65) Prior Publication Data
US 2022/0350384 A1    Nov. 3, 2022

(30) Foreign Application Priority Data
Apr. 28, 2021  (TW) ................................ 110115342

(51) Int. Cl.
G06F 1/20    (2006.01)
G06F 1/28    (2006.01)
H05K 7/20   (2006.01)

(52) U.S. Cl.
CPC ............... *G06F 1/206* (2013.01); *G06F 1/28* (2013.01); *H05K 7/2039* (2013.01)

(58) Field of Classification Search
CPC ................................. G06F 1/206; G06F 1/28
See application file for complete search history.

(56) References Cited

U.S. PATENT DOCUMENTS

| | | | |
|---|---|---|---|
| 8,449,173 B1* | 5/2013 | Strong ................ | G01M 99/002 374/57 |
| 10,833,668 B2 | 11/2020 | Lai et al. | |
| 2004/0128101 A1* | 7/2004 | Hermerding, II ........ | G01K 7/42 374/E7.042 |
| 2007/0097620 A1* | 5/2007 | Leech ...................... | G06F 1/206 361/679.54 |
| 2008/0154536 A1* | 6/2008 | McMillan ............... | G06F 1/206 702/132 |
| 2009/0210190 A1* | 8/2009 | Carlson .................. | G01K 3/005 702/130 |

(Continued)

FOREIGN PATENT DOCUMENTS

TW    202105912    2/2021

*Primary Examiner* — Mark A Connolly
(74) *Attorney, Agent, or Firm* — JCIPRNET (57) ABSTRACT

A method for detecting heat dissipation is provided, including the following steps: sensing a core temperature of a heat emitting component of an electronic device; sensing current power of the heat emitting component when the core temperature is greater than or equal to a warning temperature; and transmitting an assembling check prompt and activating a thermal control circuit (TCC) when the current power is less than thermal design power (TDP) of the heat emitting component. An electronic device is further provided, to execute the method for detecting heat dissipation.

12 Claims, 5 Drawing Sheets

(56) References Cited

U.S. PATENT DOCUMENTS

2010/0034235 A1\* 2/2010 Chen .................. G01N 25/18
    374/44
2016/0081231 A1\* 3/2016 Berke .................. G06F 1/206
    361/679.54

\* cited by examiner

METHOD FOR DETECTING HEAT DISSIPATION AND ELECTRONIC DEVICE

CROSS-REFERENCE TO RELATED APPLICATION

This application claims the priority benefit of Taiwan Application Ser. No. 110115342, filed on Apr. 28, 2021. The entirety of the above-mentioned patent application is hereby incorporated by reference herein and made a part of the specification.

BACKGROUND OF THE INVENTION

Field of the Invention

The disclosure relates to a method for detecting heat dissipation.

Description of the Related Art

Generally, when an electronic device is overclocked, it needs a higher operating voltage, easily causing a large temperature rise of the electronic device. When a temperature of the electronic device is beyond a tolerable temperature range of the electronic device, it causes a shutdown or damage to the device. Therefore, a thermal control circuit (TCC) provided with an automatic underclocking mechanism is generally built inside an electronic device with an adjustable operating frequency. For a central processing unit (CPU), when a temperature of the CPU is excessively high due to factors such as long-time overclocking, the CPU automatically turns its operating frequency down according to a setting of the automatic underclocking mechanism, to prevent a shutdown or damage to the device.

However, the automatic underclocking mechanism causes the CPU to fail to effectively stabilize its operating frequency during overclocking, reducing operating efficiency of the CPU. In addition, other factors also possibly cause a large temperature rise of the electronic device. When the operating frequency is indiscriminately reduced as long as the temperature exceeds a threshold, the operating efficiency of the electronic device is dramatically affected.

BRIEF SUMMARY OF THE INVENTION

According to the first aspect, a method for detecting heat dissipation is provided. The method for detecting heat dissipation includes the following steps: sensing a core temperature of a heat emitting component of an electronic device; sensing current power of the heat emitting component when the core temperature is greater than or equal to a warning temperature; transmitting an assembling check prompt and activating a TCC when the current power is less than thermal design power (TDP) of the heat emitting component.

According to the second aspect, an electronic device is provided. The electronic device includes a temperature sensor, a power sensor, and a processor. The temperature sensor is disposed in a heat emitting component of the electronic device, and is configured to sense a core temperature of the heat emitting component. The power sensor is disposed in the heat emitting component of the electronic device, and is configured to sense current power of the heat emitting component. The processor is coupled to the temperature sensor and the power sensor, includes a TCC, and is configured to: determine whether the core temperature is greater than or equal to a warning temperature, and if the core temperature is greater than or equal to the warning temperature, control the power sensor to sense the current power; determine whether the current power is less than TDP of the heat emitting component; and transmit an assembling check prompt and activate the TCC when the current power is less than the TDP of the heat emitting component.

Based on the above, according to the method for detecting heat dissipation and the electronic device using the same in the disclosure, when it is sensed that the core temperature of the heat emitting component is greater than the warning temperature, the processor first determines whether the current power of the heat emitting component is less than the TDP of the heat emitting component; and if yes, the processor transmits the assembling check prompt and activates the TCC. Therefore, times of operating frequency of the processor being unnecessarily reduced are decreased, to improve system efficiency. Moreover, the assembling check prompt sent by the processor warns technical personnel to check some assembling problems such as whether a thermal adhesive is applied in a sufficient quantity or whether a heat sink is thermally coupled to the heat emitting component, to effectively exclude the factor of improper assembling causing system overheating.

DETAILED DESCRIPTION OF THE EMBODIMENTS

Figure 1:
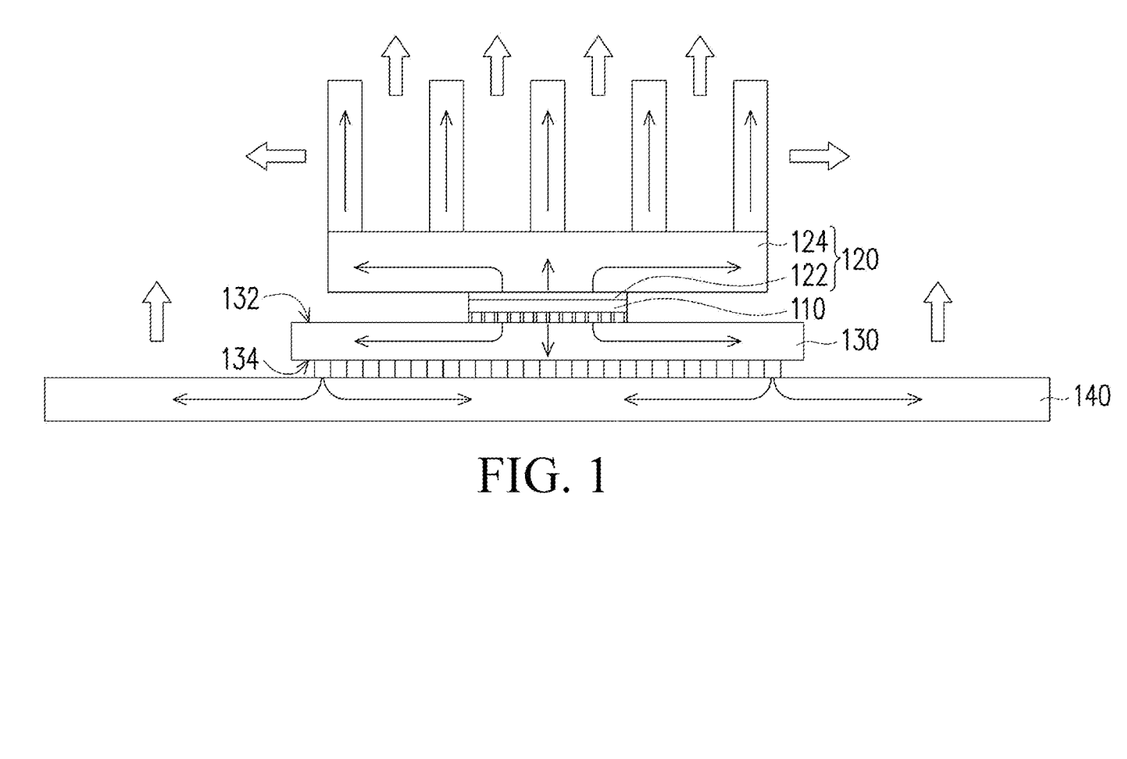
FIG. 1 is a schematic assembling diagram of a heat emitting component and a heat dissipation component according to an embodiment of the disclosure.
Figure 2:
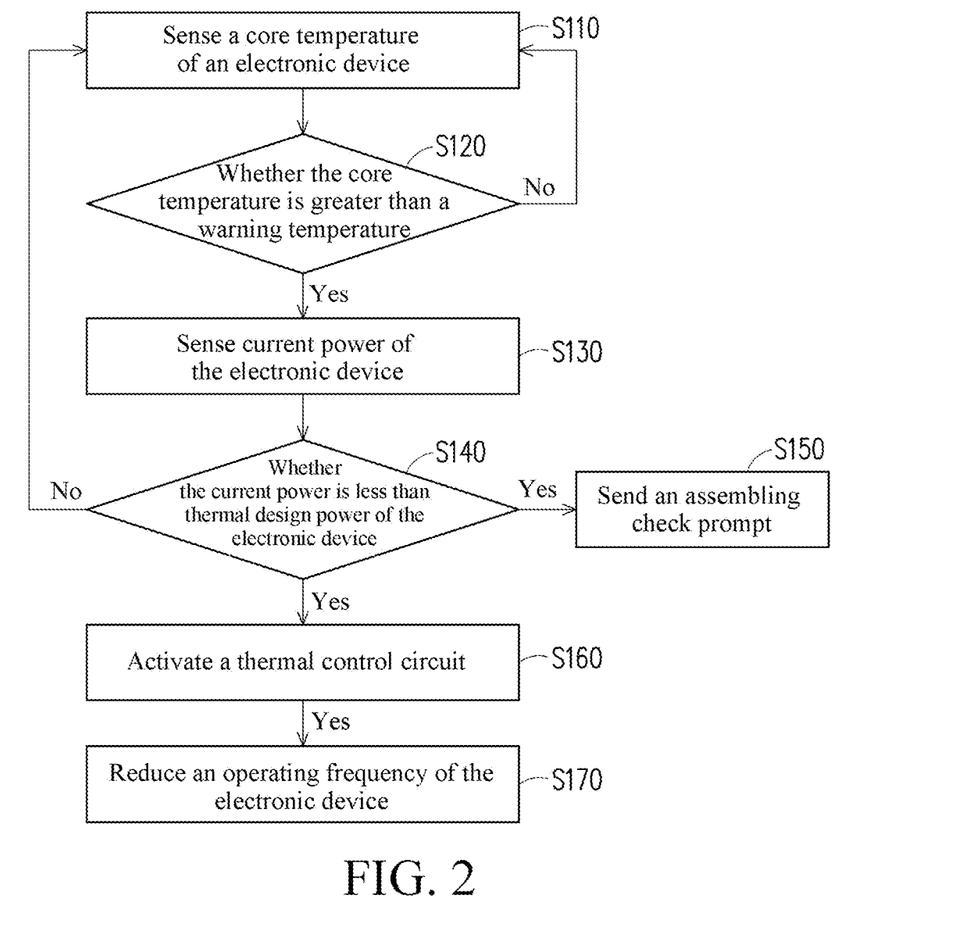
FIG. 2 is a schematic flowchart of a method for detecting heat dissipation according to an embodiment of the disclosure.

Referring to FIG. 1 and FIG. 2, in an embodiment, an electronic device 100 includes a heat emitting component 110 and a heat dissipation component 120 disposed on the heat emitting component. The electronic device 100 includes a notebook computer, a smartphone, a desktop computer, a game console, a tablet computer, and other types of personal computers of hand-held devices. In this embodiment, the electronic device 100 is a laptop computer. It is to be understood that it is also applicable to other electronic devices.

In some embodiments, the heat emitting component 110 of the electronic device 100 includes a system on chip (SOC), a CPU, a digital signal processor (DSP), a micro processing unit (MPU), a micro control unit (MCU), and other components easily producing high heat during operation. In this embodiment, the heat emitting component 110 is a SOC. In this embodiment, the heat emitting component 110 is engaged with and electrically connected to a package substrate 140. Specifically, in an embodiment, the heat emitting component 110 is first disposed on an intermediary board 130. The intermediary board 130 is provided with a chip mounting side 132, a transfer side 134 opposite to the chip mounting side 132, and a plurality of conductive through-silicon vias (TSVs) (not shown) connecting the chip mounting side 132 and the transfer side 134. The transfer side 134 is provided with a redistribution layer (RDL) (not shown). In this way, electrode pads of the heat emitting component 110 (chip) with a smaller clearance are electrically bonded to the chip mounting side 132 by using a plurality of conductive bumps, and are electrically bonded to the package substrate 140 with a larger clearance at the RDL by using a plurality of conductive components such as bumps. In some embodiments, the package substrate 140 is a circuit board or a main board. Definitely, this embodiment does not limit configurations between the heat emitting component 110 and other components.

In an embodiment, the heat dissipation component 120 includes a thermal adhesive 122 and/or a heat sink 124. In this embodiment, the heat sink 124 is disposed on a back surface (chip back) of the heat emitting component 110, and is designed for electrical isolation from an input/output current. The thermal adhesive 122 is disposed between the heat sink 124 and the heat emitting component 110. In other words, the heat sink 124 is thermally coupled to the heat emitting component 110 by using the thermal adhesive 122. In this embodiment, the thermal adhesive 122 includes a thermal interface material (TIM) formed by a dielectric material with high thermal conductivity. Generally, the thermal adhesive 122 is usually a thermal spreader configured to transfer excess heat from the heat emitting component 110 to the heat sink 124. The TIM includes a thermal grease, a grease material, an elastomer tape, a phase-change material, or the like. In other embodiments, the TIM is alternatively a component such as a clearance pad or a thermal pad. Under some conditions, when the thermal adhesive 122 is not evenly coated or is not coated in a sufficient quantity, or the heat emitting component 110 is not adhered properly and closely to the heat dissipation component 120, heat dissipation efficiency is likely to be reduced, causing an excessively high core temperature of the heat emitting component 110 and causing the electronic device 100 to activate unnecessary underclocking or other protection mechanisms to lower the temperature to maintain normal operation.

Figure 4:
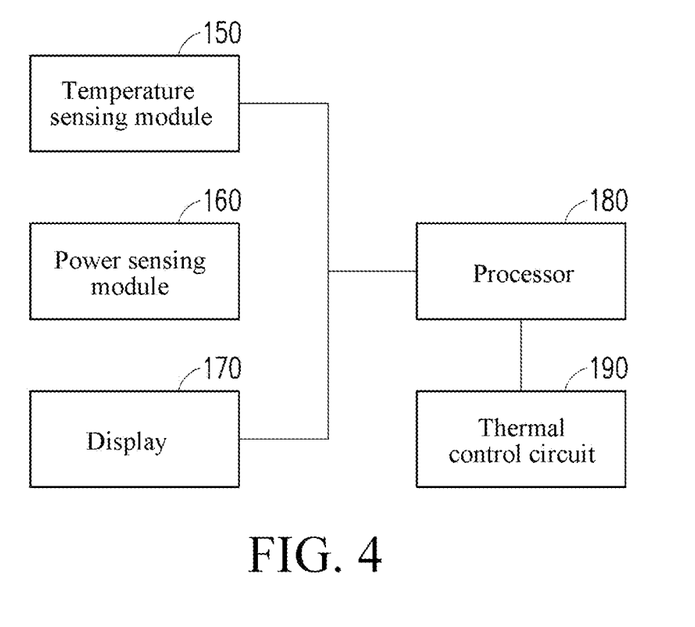
FIG. 4 is a schematic block diagram of an electronic device according to an embodiment of the disclosure.

In an embodiment, the electronic device 100 detects heat dissipation by using the following described method for detecting heat dissipation to ensure proper assembling of the heat dissipation component 120 of the electronic device 100, and decrease times of activating an unnecessary protection mechanism. Referring to FIG. 2 and FIG. 4, in some embodiments, the electronic device 100 further includes a temperature sensor 150, a power sensor 160, a display 170, and a processor 180 coupled to the temperature sensor 150, the power sensor 160, and the display 170. In an embodiment, the temperature sensor 150 and the power sensor 160 are disposed in the heat emitting component (SOC) 110. The temperature sensor 150 is configured to sense a core temperature of the electronic device, and the power sensor 160 is configured to sense current power of the electronic device 100. In an embodiment, the heat emitting component 110 includes the processor 180. In other words, the processor 180 is disposed in the heat emitting component 110 of the electronic device 100. More specifically, the processor 180 is a heat source of the heat emitting component 110.

Under such configurations, the method for detecting heat dissipation includes the following steps. First, step S110 is performed to detect a core temperature of the electronic device 120. Specifically, the temperature sensor 150 detects a core temperature of the heat emitting component 110 of the electronic device 120. Next, step S120 is performed to determine whether the core temperature is greater than or equal to a warning temperature. In some embodiments, when the core temperature detected by the temperature sensor 150 is less than the warning temperature, step S110 is performed, that is, the temperature sensor 150 continues to detect (monitor) the core temperature of the electronic device 120. When the core temperature is greater than or equal to the warning temperature, step S130 is performed to detect current power of the electronic device 120. Specifically, when the core temperature detected by the temperature sensor 150 is greater than or equal to a warning temperature preset by a system, the processor 180 controls the power sensor 160 to detect current power of the heat emitting component 110 of the electronic device 120. In some embodiments, the processor further obtains power consumption of the heat emitting component 110 according to the current power of the heat emitting component 110. The power consumption herein refers to an amount of energy consumed by the heat emitting component 110 in a unit time. In some embodiments, after the processor 180 receives the current power of the heat emitting component 110 detected by the power sensor 160, the processor correspondingly calculates current power consumption of the heat emitting component 110, that is, an amount (W) of energy consumed by the heat emitting component 110 in a unit time.

Next, step S140 is performed, that is, the processor 180 determines whether the current power is less than TDP of the heat emitting component 110. In some embodiments, the TDP is also referred to as thermal design power consumption, which generally refers to maximum heat produced by the heat emitting component 110 during working (such as executing an actual application program). Correspondingly, when the processor 180 determines that the current power of the heat emitting component 110 is equal to the TDP of the heat emitting component 110, which indicates that the heat dissipation component 120 has the capability to dissipate heat currently produced by the heat emitting component 110 and does not need to activate a TCC 190 to start underclocking or other protection mechanisms, step S110 is performed, that is, the temperature sensor 150 continues to detect (monitor) the core temperature of the electronic device 120.

When the processor 180 determines that the current power of the heat emitting component 110 is less than the TDP, the processor 180 correspondingly transmits an assembling check prompt (step S150) and activates the TCC 190 (step S160). Specifically, when the core temperature detected by the temperature sensor 150 is greater than or equal to the warning temperature but the current power of the heat emitting component 110 is less than the TDP, it represents that the system has activated a high temperature protection mechanism (such as underclocking). In this case, in addition to activating the TCC 190 to prevent damage to the heat emitting component 110, the processor 180 transmits the assembling check prompt. It is possible that assembling between the heat dissipation component 120 and the heat emitting component 110 is improper, resulting in a failure to effectively dissipate heat of the heat emitting component 110 by using the heat dissipation component 120, and causing an excessively high temperature of the heat emitting component 110. Therefore, the processor 180 correspondingly transmits the assembling check prompt to prompt technical personnel (such as technical personnel for a heat dissipation detection or burn-in test machine) to check assembling of components of the electronic device.

In an embodiment, the sent assembling check prompt includes prompting technical personnel to check an engagement status between the heat dissipation component 120 and the heat emitting component 110, such as whether the heat emitting component 110 is adhered fully and closely to the thermal adhesive 122 and the heat sink 124, to form good thermal coupling and reduce thermal resistance between the heat dissipation component 120 and the heat emitting component 110. In some embodiments, the sent assembling check prompt further includes prompting technical personnel to check whether the thermal adhesive is applied in a sufficient quantity or whether the heat sink is thermally coupled to the heat emitting component.

In an embodiment, the activating the TCC 190 includes reducing an operating frequency of the heat emitting component 110 (step S170). Specifically, the TCC 190 includes two working states: an activated state and an inactivated state. When the TCC 190 is activated, the TCC 190 reduces an effective frequency of the heat emitting component 110 (that is, performs underclocking) in a manner of a throttle duty cycle, to reduce power consumption. After the TCC 190 is activated, step S110 is performed, that is, the temperature sensor 150 continues to detect (monitor) the core temperature of the electronic device 120. After the core temperature of the heat emitting component 110 is reduced (in an embodiment, 1° C. or more less than the warning temperature), the TCC 190 resumes to the inactivated state, and the heat emitting component 110 resumes to a nominal frequency so that the electronic device 100 operates normally.

Figure 3:
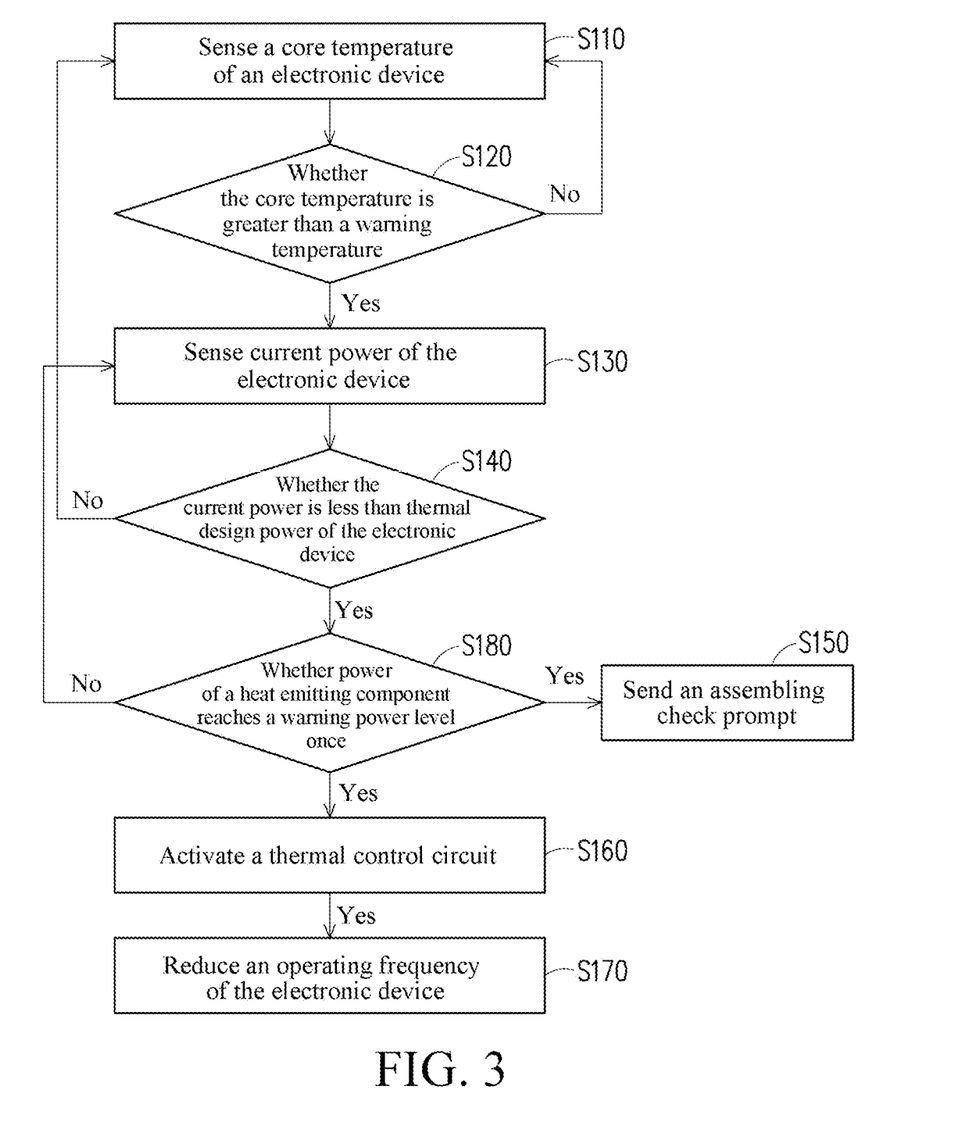
FIG. 3 is a schematic flowchart of a method for detecting heat dissipation according to an embodiment of the disclosure.
Figure 5:
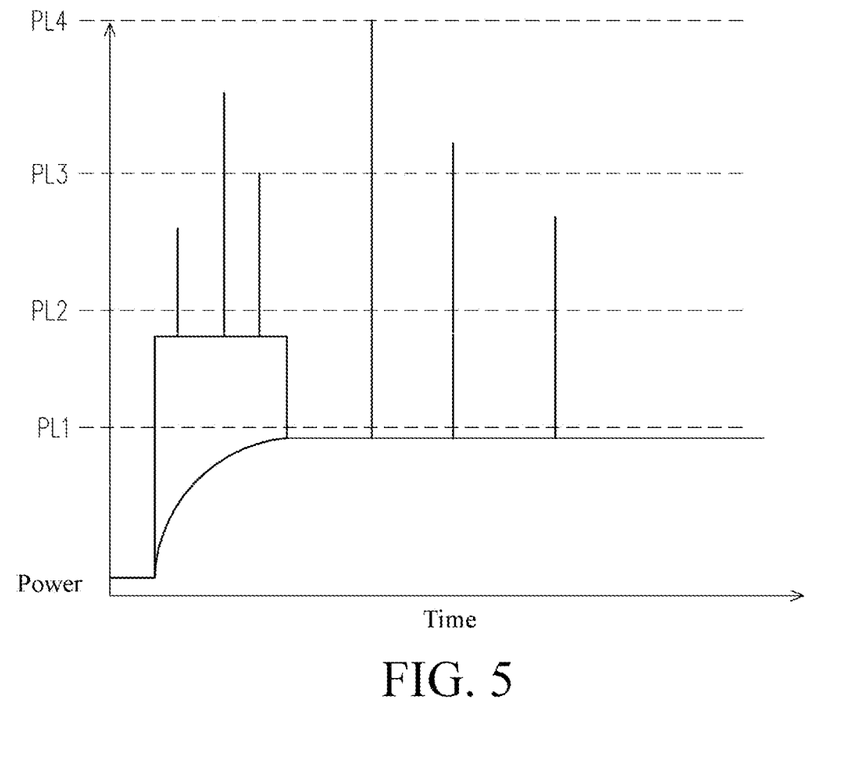
FIG. 5 is a schematic diagram of a relationship between time and power of an electronic device according to an embodiment of the disclosure.

FIG. 3 is a schematic flowchart of a method for detecting heat dissipation according to an embodiment of the disclosure. FIG. 5 is a schematic diagram of a relationship between time and power of an electronic device according to an embodiment of the disclosure. It is to be noted herein that, the method for detecting heat dissipation of this embodiment is similar with the foregoing method for detecting heat dissipation. Therefore, this embodiment follows the component numbers and partial contents of the foregoing embodiments, the same reference numbers are used to indicate the same or similar devices, and the description of the same technical contents is omitted. For the explanation of the omitted parts, refers to the foregoing embodiments, which is not repeated this embodiment. Differences between the method for detecting heat dissipation of this embodiment and the method for detecting heat dissipation of the foregoing embodiments are described below.

Referring to FIG. 3 to FIG. 5, in some embodiments, after the processor 180 determines that the current power of the heat emitting component 110 is less than the TDP (step S140), step S180 is performed, that is, the processor 180 determines whether power of the heat emitting component 110 reaches a warning power level once. In some embodiments, specifically, the heat emitting component 110 roughly includes four power levels, namely, a first power level PL1, a second power level PL2, a third power level PL3, and a fourth power level PL4 shown in FIG. 5. The first power level PL1 is average power, which is the closest to the TDP of the heat emitting component 110. Therefore, the heat emitting component 110 is allowed to keep operating at this power level. The second power level PL2 is higher than the first power level PL1. From FIG. 5, it is learned that the heat emitting component 110 maintains power of the second power level PL2 about 100 seconds, and a boost state is generally a state of being at the second power level PL2. The third power level PL3 is higher than the second power level PL2, and the heat emitting component 110 maintains power of the third power level PL3 about 10 milliseconds. The fourth power level PL4 is an ultimate power level not allowed to be overstepped. In this embodiment, the warning power level is designed to the second power level PL2 or the third power level PL3, which is greater than the TDP of the heat emitting component 110.

In an embodiment, the TDP of the heat emitting component 110 changes with different heat emitting components (such as different SOC models). However, criteria of the foregoing four power levels (PL1, PL2, PL3, and PL4) are unchanged. Therefore, this embodiment, in addition to determining that the current power of the heat emitting component 110 is less than the TDP, the processor further determines whether the power of the heat emitting component 110 reaches the (higher-level) warning power level once. When the processor 180 determines that the power of the heat emitting component 110 reaches the warning power level (such as the second power level PL2 or the third power level PL3) once, it represents that the power of the heat emitting component 110 is surely in a warning state, and the processor correspondingly transmits the assembling check prompt (step S150) and activates the TCC 190 (step S160). When the processor 180 determines that the current power of the heat emitting component 110 does not reach the warning power level, step S130 is performed, that is, the power sensor 160 continues to detect (monitor) the current power of the heat emitting component 110.

In some embodiments, a method for determining whether the power of the heat emitting component 110 reaches the warning power level once is exemplarily described below. The electronic device further includes a buffer coupled to the processor 180 and configured to store at least one flag. In this embodiment, the flag indicates whether the power of the heat emitting component 110 reaches the warning power level once. In an embodiment, when the power of the heat emitting component 110 reaches the warning power level once, a flag value is 1, and when the power of the heat emitting component 110 does not reach the warning power level once, the flag value is 0. In this way, after the processor 180 determines that the current power of the heat emitting component 110 is less than the TDP, the processor queries for the flag value stored in the buffer to determine whether the power of the heat emitting component 110 reaches the warning power level once, and correspondingly transmits the assembling check prompt and activates the TCC 190, or continues to detect (monitor) the current power of the heat emitting component 110.

In summary, according to the method for detecting heat dissipation and the electronic device using the same of the disclosure, when it is sensed that the core temperature of the heat emitting component is greater than the warning temperature, different from a conventional method in which the TCC of the processor is directly activated to reduce an effective frequency, the processor first determines whether the current power of the heat emitting component is less than the TDP of the heat emitting component; and when yes, the processor transmits the assembling check prompt and activates the TCC. Therefore, times of operating frequency of the processor being unnecessarily reduced are decreased, to improve system efficiency. Moreover, the assembling check prompt sent by the processor warns technical personnel to check some assembling problems, such as whether the thermal adhesive is applied in a sufficient quantity or whether the heat sink is thermally coupled to the heat emitting component, to effectively exclude the factor of improper assembling causing system overheating.

What is claimed is:

1. A method for detecting heat dissipation, comprising:
   sensing a core temperature of a heat emitting component of an electronic device;
   sensing current power of the heat emitting component when the core temperature is greater than or equal to a warning temperature;
   determining whether power of the heat emitting component reached a warning power level once when the current power is less than thermal design power (TDP) of the heat emitting component, wherein the warning power level is greater than the TDP; and
   transmitting an assembling check prompt and activating a thermal control circuit (TCC) when the power of the heat emitting component reached the warning power level once.

2. The method for detecting heat dissipation according to claim 1, wherein the electronic device further comprises a heat dissipation component disposed on the heat emitting component.

3. The method for detecting heat dissipation according to claim 2, wherein the assembling check prompt comprises checking an engagement status between the heat dissipation component and the heat emitting component.

4. The method for detecting heat dissipation according to claim 2, wherein the heat dissipation component comprises a thermal adhesive or a heat sink.

5. The method for detecting heat dissipation according to claim 4, wherein the assembling check prompt comprises checking whether the thermal adhesive is applied in a sufficient quantity or whether the heat sink is thermally coupled to the heat emitting component.

6. The method for detecting heat dissipation according to claim 1, wherein the activating a TCC comprises reducing an operating frequency of the heat emitting component.

7. An electronic device, comprising:
   a temperature sensor, disposed in a heat emitting component of the electronic device, and configured to sense a core temperature of the heat emitting component;
   a power sensor, disposed in the heat emitting component of the electronic device, and configured to sense current power of the heat emitting component; and
   a processor, coupled to the temperature sensor and the power sensor, comprising a thermal control circuit (TCC), and configured to:
   determine whether the core temperature is greater than or equal to a warning temperature, and controlling the power sensor to sense the current power when the core temperature is greater than or equal to the warning temperature;
   determine whether the current power is less than thermal design power (TDP) of the heat emitting component;
   when the current power is less than the TDP of the heat emitting component, determining whether power of the heat emitting component reached a warning power level once, wherein the warning power level is greater than the TDP; and
   transmit an assembling check prompt and activate the TCC when the current power is less than the TDP of the heat emitting component and the power of the heat emitting component reached the warning power level once.

8. The electronic device according to claim 7, further comprising a display coupled to the processor, wherein, the processor controls the display to display the assembling check prompt when the current power is less than the TDP of the heat emitting component.

9. The electronic device according to claim 7, wherein the electronic device further comprises a heat dissipation component disposed on the heat emitting component.

10. The electronic device according to claim 9, wherein the assembling check prompt comprises checking an engagement status between the heat dissipation component and the heat emitting component.

11. The electronic device according to claim 9, wherein the heat dissipation component comprises a thermal adhesive or a heat sink, and the assembling check prompt comprises checking whether the thermal adhesive is applied in a sufficient quantity or whether the heat sink is thermally coupled to the heat emitting component.

12. The electronic device according to claim 7, wherein the activating the TCC comprises reducing an operating frequency of the heat emitting component.

* * * * *